United States Patent [19]

Erickson

[11] 4,435,683
[45] Mar. 6, 1984

[54] RF IMBALANCE DETECTOR
[75] Inventor: Alan R. Erickson, Marion, Iowa
[73] Assignee: Rockwell International Corporation, El Segundo, Calif.
[21] Appl. No.: 252,522
[22] Filed: Apr. 9, 1981
[51] Int. Cl.³ .............................................. G01R 19/00
[52] U.S. Cl. ...................................... 330/2; 330/298; 330/207 P
[58] Field of Search ............... 330/2, 207 P, 286, 287, 330/295, 298, 124 R

[56] References Cited
U.S. PATENT DOCUMENTS
4,132,954 1/1979 Sidhu ................................... 330/295
4,307,349 12/1981 Thorpe et al. ...................... 330/287

Primary Examiner—James B. Mullins
Assistant Examiner—G. Wan
Attorney, Agent, or Firm—Richard K. Robinson; George A. Montanye; H. Fredrick Hamann

[57] ABSTRACT

The disclosed RF imbalance detector detects degradation in the performance of either a first or a second radio frequency amplifier and includes a means for monitoring the output of the radio frequency amplifiers. A comparator compares the two monitored outputs and provides a third signal which is converted into a usable signal that represents any RF imbalance between the amplifiers.

11 Claims, 3 Drawing Figures

RF IMBALANCE DETECTOR

The Government has rights in this invention pursuant to contract number F09603-79-C-3989 with the Department of the Air Force.

BACKGROUND OF THE INVENTION

This invention relates to detectors for detecting Radio Frequency (RF) imbalances between radio frequency amplifiers.

Dual radio frequency (RF) amplifiers are used to increase the output power of radio frequency amplifiers beyond the power capabilities of the amplifying components and require, for maximum efficiency, that each amplifier provide equal amplification to the signal that is being amplified. In the event that one of the RF amplifiers outputs is degraded, corrective action must be taken to prevent damage if the dual radio frequency amplifiers are to continue operation. If corrective action is not taken, one amplifier, in order to compensate for the degraded output of the other amplifier, will be, in the prior art circuits, overdriven in order to maintain the desired output power of the dual radio frequency amplifiers. This can lead to signal degradation as well as failures of the amplifying components. Thus, the output from both RF amplifiers must be monitored.

In the prior art the amplifiers were monitored either by thermal sensing, DC power supply current sensing or sensing DC analogs of the RF voltage. Each of the above methods of monitoring the RF amplifiers has several drawbacks. For example, thermal sensing has been found to be very slow acting, and is difficult to install because of the requirement of simultaneously providing a thermal bond and electrical isolation. DC current sensing of the DC power supplies will indicate a catastrophic failure but this method is generally unreliable for detecting degradation in the performance of the amplifiers. Obtaining a DC voltage analog or rectified representation of each RF output signal is an improvement over the other two methods, however, no phase information is provided and harmonic distortion is a problem. Although fault indication may be either a positive or negative DC voltage, it is normally a low DC voltage output and is thus difficult to monitor.

SUMMARY OF THE INVENTION

The disclosed RF imbalance detector detects degradation in performance in either a first or a second radio frequency amplifier and includes a means for monitoring the output of dual radio frequency amplifiers. A comparator compares the two outputs and provides a third signal which is converted into a usable signal that represents an RF imbalance between the amplifiers.

The disclosed circuit through the use of hybrid combiners ensures that the same impedance is provided to both amplifiers and as such the output voltage amplitude and phase are comparable. Additionally, power is dissipated in the load connected to the combiner difference port only if there is an imbalance between the amplifiers power outputs.

Monitoring of the outputs from the dual radio frequency power amplifiers is accomplished by a capacitor bridge network which has two series-connected capacitors, the first connected between the output of one of the radio frequency power amplifiers and a reference potential such as chassis ground, and a similar series capacitor connection across the output of the second radio frequency amplifier and the reference potential. The two series-connected sets of capacitors are joined together at their junctions by means of a diode which only conducts in the event of an imbalance between the RF amplifiers.

It is the objective of the invention to provide an RF imbalance detector that will detect RF imbalance between the outputs of dual radio frequency amplifiers.

It is another object to provide an RF imbalance detector that has low harmonic distortion and provides an accurate indication of signal degradation from either of the radio frequency amplifiers including an improper phase relationship.

BRIEF DESCRIPTION OF THE DRAWINGS

Many advantages of the present invention may be ascertained from a reading of the specification and the claims in conjunction with the drawings in which:

DETAILED DESCRIPTION OF THE PREFERRED EMBODIMENT

Figure 1:
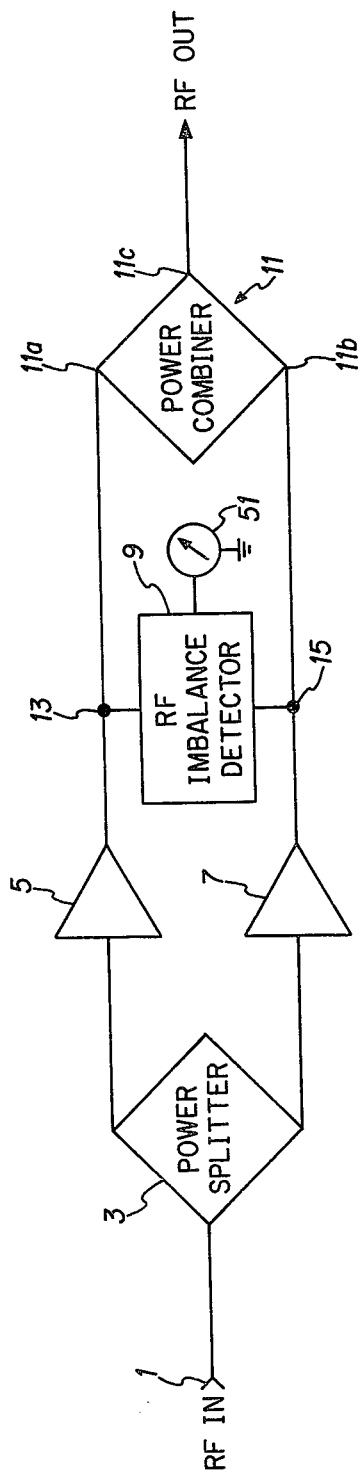
FIG. 1 is a simplified diagram of the radio frequency power amplifier circuits according to the invention.

In FIG. 1 to which reference should now be made, there is shown a radio frequency amplifier 100 whose output power requirement necessitates the use of dual amplifiers that include the amplifier 5 and amplifier 7. The input to the radio frequency amplifier 100 is applied via the RF IN connector 1 to a power splitter 3 which in the preferred embodiment is a hybrid device that divides the input signal into equal power signals, the first of which is applied to amplifier 5 and the second of which is applied to amplifier 7. The output from the amplifiers is recombined by the power combiner 11 which in the case of the preferred embodiment is also a hybrid device. The hybrid combiner is a device that provides the same impedance to each amplifier module. It also provides for module isolation in that a signal appearing at only one input terminal is highly attenuated at the other input terminal but appears on the output terminal and also the difference terminals.

To ensure that both the amplifiers are operating within their respective design specification, there is a radio frequency imbalance detector 9 that is connected to the output terminal 13 of amplifier 5 and the output terminal 15 of amplifier 7. The RF imbalance detector 9 will detect an imbalance in the output of the two amplifiers and provide an indication of the imbalance via indicator 51 which may be, as in the preferred embodiment, a device which will inhibit the operations of both amplifiers 5 and 7 if there is a radio frequency imbalance. The output of the amplifier 5 is applied to the power combiner 11 via terminal 11a where it is combined with the output amplifier 7 which is coupled to the power combiner 11 via terminal 11b. The combined amplified RF signal is provided on output terminal 11c of the power combiner 11.

Figure 2:
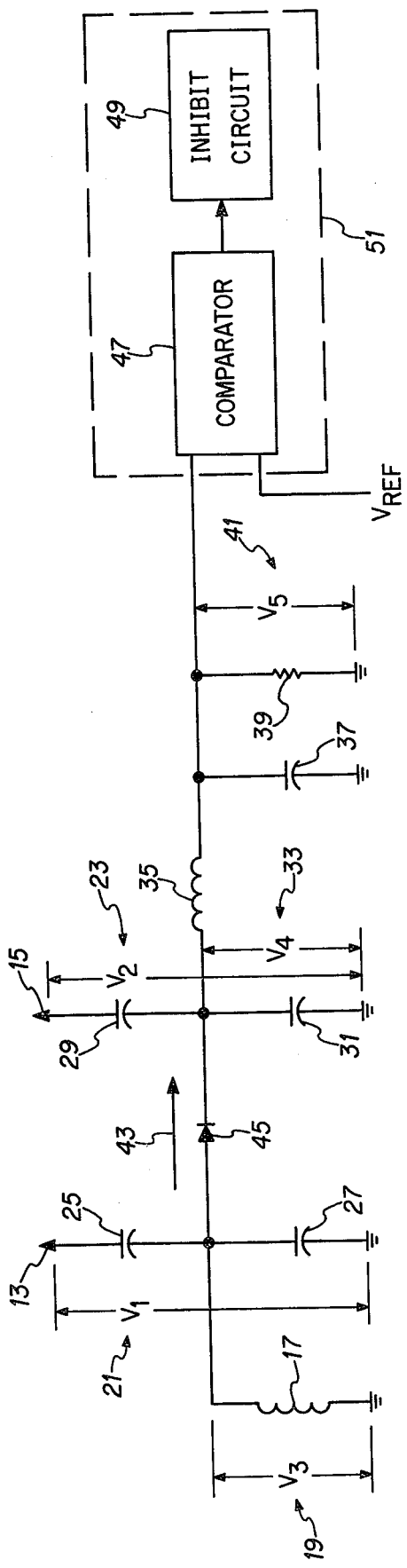
FIG. 2 is a schematic diagram of the radio frequency imbalance detector according to the invention.

In FIG. 2 there is shown a schematic diagram of the RF imbalance detector 9 which provides for monitoring the voltage $V_1$ as indicated by dimension lines 21 that is present at terminal 13 which is the output terminal of amplifier 5 and also monitoring the voltage $V_2$ as indicated by dimension lines 23, which is the voltage that is present at terminal 15, the output terminal of the amplifier 7. The voltage at both terminals 13 and 15 is applied to a capacitor divider network that consists of two series connected capacitors. Terminal 13 is connected to the divider network that includes capacitors 25 and 27 whereas terminal 15 is connected to the divider network that includes capacitors 29 and 31. The junction between capacitor 25 and 27 is held at DC ground potential at the inductor 17. Diode 45 connects the junction of capacitors 25 and 27 to the junction of capacitors 29 and 31. Inductor 35 blocks the RF current and conducts any DC current from the junction of capacitors 29 and 31 to filter capacitor 37 for filtering. Resistor 39 converts the filtered DC current to the voltage $V_5$. The selection of the direction of current flow through the diode 45 is shown by the arrow 43 to provide a positive voltage $V_5$ across resistor 39 in the event there is a radio frequency imbalance between the amplifier 5 and the amplifier 7. The voltage $V_5$ is indicated by dimension lines 41. Alternatively, the reversal of the diode 45 will ensure that the voltage across the resistor 39 ($V_5$) will be negative with respect to the ground reference.

The divider network that consists of capacitors 27 and 25 is selected such that the ratio of the capacitance of the capacitor 27 to the capacitance of the capacitor 25 should equal the ratio of the capacitance in the divider network that includes capacitor 31 and capacitor 29. The ratio of the capacitance of the capacitors 31 to 29 should equal the ratio of the capacitance of capacitors 27 to 25. Given this relationship, when the RF voltage $V_1$ and $V_2$ are identical, then the RF voltage that is developed across the capacitor 27 ($V_3$) as indicated by dimension lines 19 is equal to the RF voltage ($V_4$) that is developed across capacitor 31 as indicated by dimension lines 33 and no current, as indicated by flow arrow 43, will flow through the diode 45. Thus, the DC component of the voltages $V_3$, $V_4$ and the output voltage $V_5$ is 0. In this condition, since there is no rectification by the diode 45, no harmonic distortion is generated.

When $V_1$ differs from $V_2$ in magnitude and/or phase, $V_3$ is no longer equal to $V_4$ and a current as indicated by flow arrows 43 flows through the diode 45 during that part of the radio frequency cycle when $V_3$ is more positive than $V_4$. The action of the diode 45 provides RF rectification and a DC voltage at $V_4$ which is positive with respect to $V_3$, $V_3$ being held at DC ground potential by the inductor 17. The DC voltage $V_4$ is RF decoupled by the inductor 35 and the capacitor 37 and appears as a filtered output voltage $V_5$ across the resistor 39. The voltage $V_5$ is detected by the comparator 47, in the preferred embodiment, which compares the voltage $V_5$ with a voltage reference (from a source not shown) and in the event the voltage $V_5$ exceeds the threshold that is established by the voltage reference, then the inhibit circuit 49 is activated. When activated, the included circuitry will disable the amplifiers 5 and 7 and thus protect the circuit from damage due to the radio frequency imbalance. An inherent minimum threshold is present in the circuit due to the need to overcome the forward conduction voltage across the diode 45.

The DC voltage $V_5$ indicates a voltage or phase imbalance and can thereby serve as an indicator of individual power amplifier imbalance, degradation or failure when $V_1$ differs from $V_2$. The amplified output voltages, exemplified by the preferred embodiment, are the RF output voltages of each individual amplifier or voltages on each side of the power combiner difference port. The latter embodiment is illustrated in FIG. 3.

Figure 3:
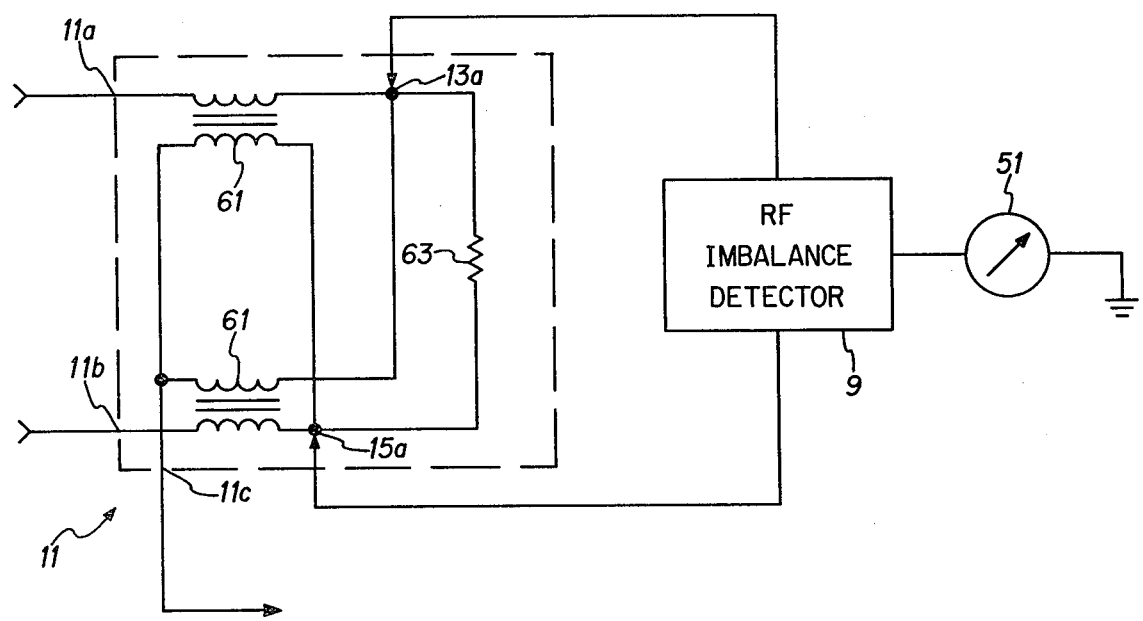
FIG. 3 is a simplified diagram of another embodiment of the invention.

In FIG. 3 there is an alternate embodiment of the connections of the RF imbalance detector 9. The power combiner 11 is comprised of two transformers 61 and a load resistor 63. The voltage on either side of the load resistor depends on the RF voltages that are applied to terminals 11a and 11b. When the input voltages are equal, the voltage on either side of the load resistor is the same. Capacitor 25 of the RF imbalance detector is connected to terminal 13A. Capacitor 29 is connected to Terminal 15A. In the event that there is an RF voltage imbalance between the outputs of amplifiers 5 and 7, there will be an RF voltage developed across resistor 63, which will then dissipate some power. This voltage difference will be detected by the RF imbalance detector 9 as discussed in conjunction with FIG. 2, and the amplifiers 5 and 7 inhibited if the reference threshold is exceeded.

Many changes and modifications in the above described embodiment of the invention can, of course, be carried out without departing from the scope thereof. Accordingly, to promote the progress in the science and the useful arts, the invention is disclosed and is intended to be limited only by the scope of the appended claims.

I claim:

1. A radio frequency imbalance detection system for detecting degradation in the performance of a plurality of radio frequency amplifiers comprising:
    means for monitoring a first radio frequency output signal from a first radio frequency amplifier, and a second radio frequency output signal from a second radio frequency amplifier;
    means for comparing said first radio frequency output signal with said second radio frequency output signal to obtain a difference signal; and
    means for detecting said difference signal for providing an imbalance indication signal when said different signal exceeds a reference signal.

2. The system of claim 1 further comprising means responsive to said imbalance indication signal for inhibiting the operation of both said first and second radio frequency amplifiers.

3. The system of claim 1 further comprising means responsive to said imbalance indication signal for displaying an imbalance condition between said first and second radio frequency amplifiers.

4. A radio frequency imbalance detection system for detecting degradation in the performance of a plurality of radio frequency amplifier circuits comprising:
    means for monitoring a first radio frequency output from a first radio frequency amplifier and a second radio frequency output from a second radio frequency amplifier, said means for monitoring comprising first and second capacitors serially coupled between the output of the first radio frequency amplifier and a reference potential and third and fourth capacitors serially coupled between the output of the second radio frequency amplifier and said reference potential, the capacitance of said first, second, third and fourth capacitors being selected such that the ratio of said second capacitor to said first cpacitor is equal to the ratio of said fourth capacitor to said third capacitor;
    means coupled to the serial coupling of said first and second capacitors and the serial coupling of said third and fourth capacitors for comparing the outputs of said first and second radio frequency amplifiers and producing a difference output; and means for comparing said difference output with a reference signal for providing an imbalance indication signal when said difference output exceeds said reference signal.

5. The system of claim 4 further comprising means responsive to said imbalance indication signal for inhibiting the operation of said first and second radio frequency amplifiers.

6. The system of claim 4 further comprising means responsive to said imbalance indication signal for displaying an imbalance between said first and second radio frequency amplifiers.

7. The system of claim 4 wherein said first and second capacitors each have a terminal coupled in common at a first junction to form said serial coupling and said third and fourth capacitors each have a terminal coupled in common at a second junction to form said serial coupling, and further wherein said means for producing a difference output includes a diode coupled between said first junction and said second junction.

8. The system of claim 7 further comprising an inductor coupled between said first junction and said reference potential.

9. The system of claim 8 further comprising a second inductor serially coupled to a fifth capacitor, said serial coupled combination of said second inductor and fifth capacitor being coupled between said second junction and said reference potential to form a radio frequency filter.

10. The system of claim 9 wherein said second inductor and fifth capacitor each have a terminal connected in common to form a third junction and further comprising a resistor coupled between said third junction and said reference potential.

11. A method for detecting an imbalance in the output performance of a plurality of radio frequency amplifiers providing outputs of a common radio frequency input signal comprising:

receiving the output of first and second radio frequency amplifiers coupled to receive a common radio frequency input signal;

comparing said received outputs of said first and second radio frequency amplifiers and providing a signal representing a difference between said outputs; and comparing said signal representing said difference with a reference signal and providing an imbalance indication signal representing an imbalance between the outputs of said amplfiers when said difference is greater than said reference signal.

* * * * *